United States Patent
Law et al.

(10) Patent No.: US 10,475,495 B2
(45) Date of Patent: Nov. 12, 2019

(54) INTEGRATED CIRCUITS WITH MAGNETIC TUNNEL JUNCTIONS AND METHODS OF PRODUCING THE SAME

(71) Applicant: Globalfoundries Singapore Pte. Ltd., Singapore (SG)

(72) Inventors: Wai Cheung Law, Singapore (SG); Taiebeh Tahmasebi, Singapore (SG); Chim Seng Seet, Singapore (SG); Kai Hung Alex See, Singapore (SG); Gerard Joseph Lim, Singapore (SG); Wen Siang Lew, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/896,431

(22) Filed: Feb. 14, 2018

(65) Prior Publication Data
US 2019/0252600 A1    Aug. 15, 2019

(51) Int. Cl.
*G11C 11/16* (2006.01)
*H01L 43/02* (2006.01)
*H01L 27/22* (2006.01)
*H01L 43/12* (2006.01)

(52) U.S. Cl.
CPC .......... *G11C 11/161* (2013.01); *H01L 27/228* (2013.01); *H01L 43/02* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 9,666,640 B2 | 5/2017 | Naik et al. | |
| 2012/0280337 A1* | 11/2012 | Cao | H01L 43/08 257/421 |
| 2015/0008550 A1* | 1/2015 | Min | H01F 10/32 257/421 |
| 2016/0171135 A1* | 6/2016 | Datta | G11C 11/161 716/136 |
| 2016/0260892 A1* | 9/2016 | Tahmasebi | H01L 43/08 |
| 2018/0366172 A1* | 12/2018 | Wang | H01L 43/08 |
| 2019/0013460 A1* | 1/2019 | Ikegawa | H01L 43/02 |

OTHER PUBLICATIONS

Alebrand et al., "Light-inducted Magnetization Reversal of High-Anisotropy TbCo Alloy Films", Applied Physics Letters, 2012, 5 pages, 101, 162408.
Ozaki et al., "TbFeCo as a Perpendicular Magnetic Recording Material", J. Magn Soc. Japan, 2001, pp. 322-327, vol. 25, No. 3-2.

* cited by examiner

*Primary Examiner* — Steven B Gauthier
(74) *Attorney, Agent, or Firm* — Thompson Hine LLP

(57) ABSTRACT

Integrated circuits and methods of producing the same are provided. In an exemplary embodiment, an integrated circuit includes a magnetic tunnel junction stack. The magnetic tunnel junction stack includes a first free layer that is magnetic, a second free layer that is magnetic, and an insertion layer positioned between the first and second free layers. The insertion layer is non-magnetic, and the insertion layer includes terbium.

9 Claims, 2 Drawing Sheets

INTEGRATED CIRCUITS WITH MAGNETIC TUNNEL JUNCTIONS AND METHODS OF PRODUCING THE SAME

TECHNICAL FIELD

The technical field generally relates to integrated circuits with magnetic tunnel junctions (MTJs) and methods of producing the same, and more particularly relates to integrated circuits with MTJs having reduced switching currents and methods of producing the same.

BACKGROUND

Magnetoresistive Random Access Memory (MRAM) is an emerging technology that may be competitive with prior integrated circuit memory technologies, such as floating gate technology. The MRAM technology may integrate silicon-based electronic components with magnetic tunnel junction technology. A significant element in MRAM is the magnetic tunnel junction (MTJ) where information may be stored. A MTJ stack has at least two magnetic layers separated by a non-magnetic barrier, where a pinned layer has a set magnetic property and a free layer has a programmable magnetic property for storing information. If the pinned layer and the free layer have parallel magnetic poles, the resistance through the MTJ stack is measurably less than if the pinned layer and the free layer have anti-parallel poles, so parallel magnetic poles may be read as a "0" and anti-parallel poles may be read as a "1." The MTJ stack is typically incorporated into a memory cell, and many memory cells with MTJ stacks are incorporated into a memory bank.

The magnetic properties of the free layer may be changed when the memory cell is programmed, where the alignment of the free layer magnetic properties is changed relative to the fixed layer magnetic properties in the programming process. Programming changes the magnetic properties of the free layer and the fixed layer from anti-parallel to parallel, or from parallel to anti-parallel. The programming process typically includes applying a charge across the MTJ stack such that a programming current passes through the MTJ stack. Reductions in the current required to program the MTJ stack improve the overall efficiency of the integrated circuit. The free layer of the MTJ stack has a perpendicular magnetic anisotropy (PMA) value, and higher PMA values improve the operation of the MTJ stack. For example, higher PMA values can increase the difference in resistance of the MTJ stack between the parallel and anti-parallel states. Also, higher PMA values can decrease the required current to program the free layer. Thermal inertness is a measure of changes in the magnetic properties of the MTJ stack before and after exposure to a thermal event, such as higher temperatures associated with soldering reflow or annealing processes. Changes to the MTJ stack that increase the thermal inertness improve the robustness of the MTJ stack and the integrated circuit.

The stability of the magnetic pole in the free magnetic layer degrades as the temperature increases, and the free layer may become demagnetized if the temperature exceeds acceptable limits. A demagnetized free layer no longer retains stored information. The integrated circuit, and the components therein, are exposed to at least a reflow temperature for soldering, so the free layer needs to be capable of retaining its magnetic properties at the reflow temperature. Other integrated circuit processing steps may be desirable after formation of the MTJ, and MTJ stacks with higher thermal stability allow for processes with higher temperatures.

Accordingly, it is desirable to provide integrated circuits with magnetic tunnel junction stacks having higher thermal inertness, as compared to traditional magnetic tunnel junctions, and methods for producing the same. In addition, it is desirable to provide integrated circuits with magnetic tunnel junctions having higher thermal stability, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, an integrated circuit includes a magnetic tunnel junction stack. The magnetic tunnel junction stack includes a first free layer that is magnetic, a second free layer that is magnetic, and an insertion layer positioned between the first and second free layers. The insertion layer is non-magnetic, and the insertion layer includes terbium.

An integrated circuit is provided in another embodiment, where the integrated circuit includes a magnetic tunnel junction stack. The magnetic tunnel junction stack includes a first pinned layer that is magnetic and a first free layer that is magnetic. A tunnel barrier layer is positioned between the first pinned layer and the first free layer, where the tunnel barrier layer is non-magnetic. A transition layer is positioned between the first pinned layer and the tunnel barrier layer, where the transition layer is non-magnetic, and the transition layer includes terbium.

A method of producing an integrated circuit is provided in yet another embodiment. The method includes forming a first fixed layer that is magnetic, and forming a transition layer that is non-magnetic overlying the fixed layer. The transition layer includes terbium. A tunnel barrier layer is formed overlying the transition layer, where the tunnel barrier layer is non-magnetic, and a first free layer is formed overlying the tunnel barrier layer. The first free layer is magnetic.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

An integrated circuit includes a magnetic tunnel junction (MTJ) stack that includes a non-magnetic layer with terbium. The terbium increases the thermal inertness and thermal stability, improves the voltage control at the device level, produces higher time dependent dielectric breakdown, and improves the tunnel magnetoresistance of the MTJ stack. The terbium is used in a non-magnetic layer, as mentioned above, as opposed to being used in a magnetic layer. The use of terbium in a non-magnetic layer is quite different than the use of terbium in a magnetic layer, because magnetic properties are fundamental to the operation of MTJ stacks used in a memory cells.

Figure 1:
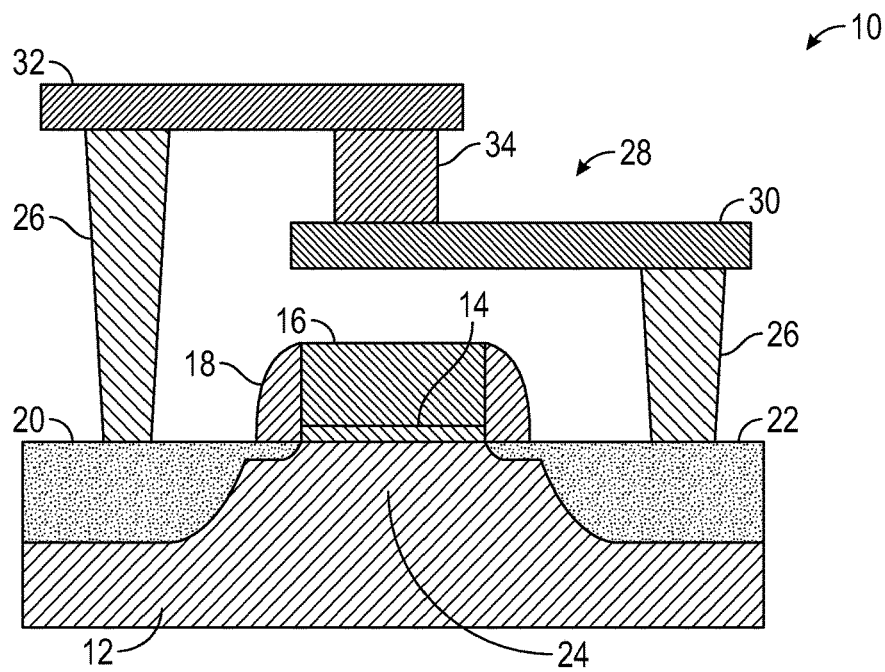
FIGS. 1-3 illustrate, in cross sectional views, an integrated circuit and methods of producing the same in accordance with exemplary embodiments.

Referring to an exemplary embodiment illustrated in FIG. 1, an integrated circuit 10 includes a substrate 12 formed of a semiconductor material. FIG. 1 omits some components of the integrated circuit 10, such as interlayer dielectrics, to more clearly illustrate the features of current interest. Furthermore, FIG. 1 depicts one embodiment, and other layouts, orientations, or configurations are also possible. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 10 weight percent or more based on the total weight of the referenced component or material, unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

In an exemplary embodiment, a gate insulator 14 overlies the substrate 12, and a gate 16 overlies the gate insulator 14. As used herein, the term "overlying" means "over" such that an intervening layer may lie between the overlying component (the gate 16 in this example) and the underlying component (the gate insulator 14 in this example,) or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of the cross-sectional figures (including FIG. 1). It is to be understood that spatially relative terms refer to the orientation in the figures, so if the integrated circuit 10 were to be oriented in another manner the spatially relative terms would still refer to the orientation depicted in the figures. Thus, the exemplary terms "over" and "under" remain the same even if the device is twisted, flipped, or otherwise oriented other than as depicted in the figures.

In an exemplary embodiment, the gate insulator 14 includes an electrically insulating material and the gate 16 includes an electrically conductive material. As used herein, an "electrically insulating material" is a material with a resistivity of about $1 \times 10^4$ ohm meters or more, an "electrically conductive material" is a material with a resistivity of about $1 \times 10^4$ ohm meters or less, and an "electrically semi-conductive material" is a material with a resistivity of from about more than $1 \times 10^{-4}$ ohm meters to less than about $1 \times 10^4$ ohm meters. In one exemplary embodiment, the gate insulator 14 includes silicon dioxide and the gate 16 includes polysilicon doped with conductivity determining impurities, but other materials may be used in alternate embodiments. Electrically insulating spacers 18 may overlie the substrate 12 adjacent to the gate insulator 14 and the gate 16, where spacers 18 are positioned on opposite sides of the gate insulator 14 and the gate 16. The spacers 18 may include silicon dioxide, silicon nitride, or other electrically insulating materials in various embodiments. A source 20 may be formed within the substrate 12 on one side of the gate 16, and a drain 22 may be formed within the substrate 12 on the opposite side of the gate 16. The source 20 and drain 22 include conductivity determining impurities (sometimes referred to as "dopants") at a higher concentration than in the substrate 12.

A channel 24 is disposed within the substrate 12 between the source 20 and drain 22 and underlying the gate 16. FIG. 1 illustrates a planar transistor 28, where the transistor 28 includes the gate insulator 14, the gate 16, the spacers 18, the source 20, and the drain 22. However, finned field effect transistors (not illustrated), transistors with the source and drain formed overlying the substrate (not illustrated), or other types of transistors 28 may be utilized in alternate embodiments.

In the illustrated embodiment, a bottom electrode 30 is in electrical communication with the drain 22, and a top electrode 32 is in electrical communication with the source 20. A contact 26 may be used to electrically connect the source 20 and drain 22 with the top and bottom electrodes 32, 30, respectively. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductive, but not electrically insulating.

A magnetic tunnel junction stack 34 (MTJ stack) is positioned between the bottom and top electrodes 30, 32, where the MTJ stack 34 is in electrical communication with the bottom and top electrodes 30, 32. In an exemplary embodiment, the bottom electrode 30 may serve as a word line, and the top electrode 32 may serve as a bit line, but other embodiments are also possible. The bottom and top electrodes 30, 32 may include several layers (not illustrated,) such as a seed layer, a core, and a cover, and may include tantalum, tantalum nitride, nickel, copper, aluminum, or other electrically conductive materials. The MTJ stack 34 and the bottom and top electrodes 30, 32 may also be connected to other electronic components instead of the transistor 28, or in addition to the transistor 28 in various embodiments. The MTJ stack 34 may be formed by depositing the various layers therewithin (described more fully below), where the various layers within the MTJ stack 34 may be formed by sputtering, ion beam deposition, or other techniques using the appropriate materials. The area where the MTJ stack 34 is to be formed may then be lithographically protected, and the exposed portions removed with appropriate etchants.

Figure 2:
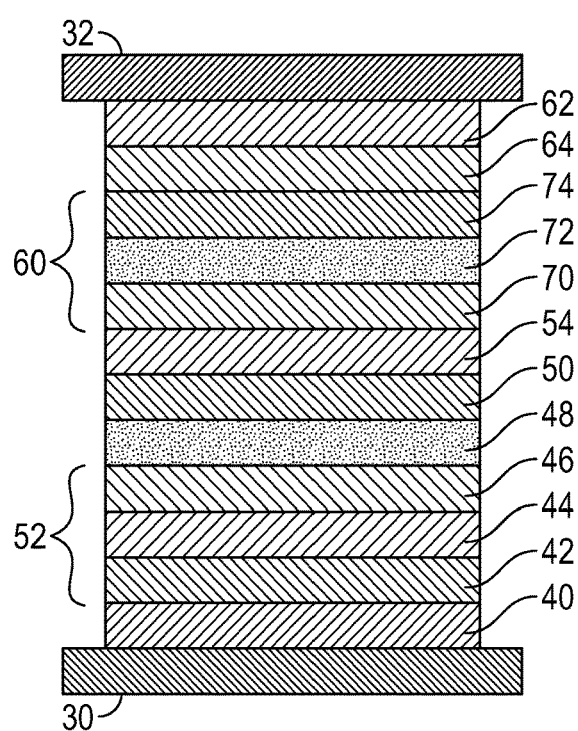

An embodiment of the MTJ stack 34 is illustrated in greater detail in FIG. 2. The MTJ stack 34 includes several layers overlying each other, where the illustrated layers may include sub-layers in some embodiments and where additional layers may also be present. In an exemplary embodiment, a seed layer 40 overlies the bottom electrode 30, a first pinned layer 42 overlies the seed layer 40, a coupling layer 44 overlies the first pinned layer 42, a second pinned layer 46 overlies the coupling layer 44, a transition layer 48 overlies the second pinned layer 46, and a polarizer layer 50 overlies the transition layer 48. In the illustrated embodiment, a total pinned layer 52 includes the first pinned layer 42, the coupling layer 44, and the second pinned layer 46. The first and second pinned layers 42, 46 are magnetic, and the coupling layer 44 is non-magnetic. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about 1 week or more after being removed from an induction magnetic field. The transition layer 48 is nonmagnetic and the polarizer layer 50 is magnetic in an exemplary embodiment.

In an exemplary embodiment, the seed layer 40 includes one or more of nickel, chromium, hafnium, platinum, ruthenium, and may also include other materials. The seed layer 40 may be used to provide a crystalline texture for overlying layers, where the crystallinity may be of a specified type to provide the desired magnetic properties for the overlying layers. For example, the seed layer 40 may be a face centered cubic crystal structure, but other types of crystallinity are also possible. The first and second pinned layers 42, 46 include cobalt platinum compounds, iron platinum compounds, cobalt palladium compounds, cobalt iron boron compounds, cobalt nickel compounds, gadolinium cobalt iron compounds, or other compounds in various embodiments. The different elements in the first and second pinned layer 42, 46 may be alloyed or formed of successive layers, so the first and second pinned layers 42, 46 may independently include a plurality of sub-layers in some embodiments. The first and second pinned layers 42, 46 are magnetic, where the magnetic property of the combined first and second pinned layers 42, 46 for the total pinned layer 52 are utilized for memory purposes in the MTJ stack 34.

The coupling layer 44 includes ruthenium, iridium or other materials in exemplary embodiments. The coupling layer 44 provides an anti-ferromagnetic exchange between the first and second pinned layers 42, 46 that may help reduce or compensate for stray magnetic field effects from the first and/or second pinned layers 42, 46.

The transition layer 48 includes tantalum, iron, tungsten, molybdenum, or other elements, either as alloys or as one or more sub-layers, in some embodiments. However, in some embodiments the transition layer 48 includes terbium, and may optionally also include iron, cobalt, and/or one or more other elements. The transition layer 48 is non-magnetic, as mentioned above, so embodiments with terbium in the transition layer result in the terbium being used in a non-magnetic layer within the MTJ stack 34. In various embodiments where the transition layer 48 includes terbium, the terbium may be present at from about 30 to about 100 weight percent, or about 50 to about 100 weight percent, or about 30 to about 90 weight percent, based on the total weight of the transition layer. In embodiments where the transition layer 48 includes terbium, iron and/or cobalt may be present at from about 5 to about 70 weight percent, but in other embodiments the transition layer 48 is essentially free of iron and/or cobalt, i.e., where iron and/or cobalt are present at a concentration of from about 0 to about 0.1 weight percent, based on the total weight of the transition layer 48. The transition layer 48 serves to break the crystalline structure from the underlying second pinned layer 46 (or other pinned layer, where more than 2 pinned layers are utilized), so the transition layer 48 is amorphous in some embodiments. The transition layer 48 may be thin enough such that a crystalline structure is not formed. The transition layer 48 is non-magnetic, and the amorphous nature of the transition layer 48 allows for the non-magnetic characteristic even in embodiments that include iron, cobalt, and/or terbium. In embodiments where the transition layer 48 includes terbium, the thermal robustness and thermal inertness of the transition layer 48 is generally higher than in embodiments where the transition layer 48 does not include terbium.

The polarizer layer 50 includes cobalt, iron, boron, or other elements, which may be present as alloys or as individual components, and which may be present as a single layer or as multiple layers, in various embodiments. The polarizer layer 50 may have a crystalline structure that is imparted to overlying layers in some embodiments, and may improve spin polarization efficiency in the MTJ stack 34. The polarizer layer 50 may have a face centered cubic crystalline structure, but other types of crystalline structure are also possible.

A tunnel barrier layer 54 overlies the polarizer layer 50, so the tunnel barrier layer 54 also overlies the transition layer 48, the total pinned layer 52, and the seed layer 40. The tunnel barrier layer 54 is non-magnetic, and magnetically decouples the free layer(s) (described more fully below) from the total pinned layer 52. The tunnel barrier layer 54 includes magnesium oxide in an exemplary embodiment, but the tunnel barrier layer 54 may be aluminum oxide or other materials suitable for magnetically decoupling overlying layers from underlying layers.

A total free layer 60 overlies the tunnel barrier layer 54, and a capping layer 62 overlies the total free layer 60. An optional top barrier layer 64 overlies total free layer 60 in some embodiments, where the capping layer 62 overlies the optional top barrier layer 64 when present. As such, the total free layer 60 is sandwiched between the tunnel barrier layer 54 and the top barrier layer 64 in embodiments where the top barrier layer 64 is present. The Top electrode 32 overlies the capping layer 62, so the top electrode 32 also overlies the optional top barrier layer 64, the total free layer 60, and the tunnel barrier layer 54. The total free layer 60 includes a first free layer 70, an insertion layer 72 overlying the first free layer, and a second free layer 74 overlying the insertion layer 72.

Figure 3:
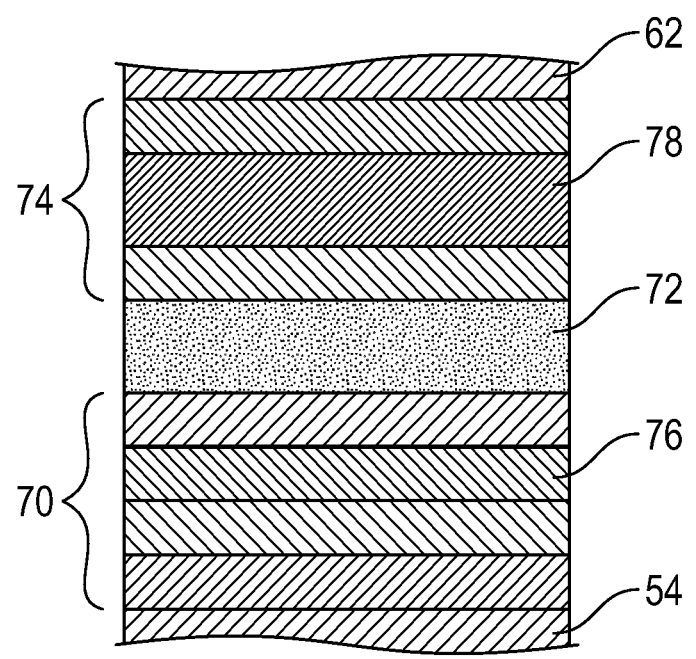

Reference is made to an embodiment illustrated in FIG. 3, with continuing reference to FIGS. 1 and 2. The first and second free layers 70, 74 are magnetic, and may include sub-layers. For example, the first free layer 70 may include 1, 2, or more first free sub-layers 76, and the second free layer 74 may include 1, 2, or more second free sub-layers 78. The first and second free layers 70, 74 may have the same composition, or they may have different compositions, and there may be more, less, or the same number of first free sub-layers 76 as there are second free sub-layers 78. The elements in the first and second free layers 70, 74 (and therefore in the first and second free sub-layers 76, 78) may be present as alloys or as elements. In an exemplary embodiment, the first and/or second free layers 70, 74 include cobalt, iron, boron, or other elements, either as alloys or as individual elements, where the materials of the first and/or second free layer 70, 74 may be present as a single layer or as multiple layers. The first and second free layers 70, 74 are magnetically "soft" such that the spin transfer torque and the direction of magnetism can be changed. The first and second free layers 70, 74 are magnetically anisotropic, and should have sufficient thermal stability to withstand processing temperatures without a loss of magnetism. The first and second free layers 70, 74 may have a thickness of from about 0.1 to about 1 nanometer in some embodiments, but other thicknesses are also possible.

The insertion layer 72 is positioned between the first and second free layers 70, 74, and the insertion layer 72 is non-magnetic. The insertion layer 72 may provide ferromagnetic coupling between the first and second free layers 70, 74, and may be thin enough to be amorphous. However, in some embodiments the insertion layer 72 may be crystalline. In some embodiments, the insertion layer 72 includes tantalum, molybdenum, tungsten, iron, or other components, as alloys or as individual elements. However, in some embodiments, the insertion layer 72 includes terbium, where the terbium is present in the insertion layer 72 at from about 30 to about 100 weight percent, or from about 50 to about 100 weight percent, or from about 30 to about 90 weight percent, based on a total weight of the insertion layer 72. The insertion layer 72 is non-magnetic, as mentioned above, so embodiments that include terbium result in the use of terbium in a non-magnetic layer within the MTJ stack 34. In some embodiments where the insertion layer 72 includes terbium, the insertion layer 72 may also include iron at from about 5 to about 70 weight percent. The insertion layer 72 may also include cobalt at from about 5 to about 70 weight percent in some embodiments where the insertion layer 72 includes terbium. The insertion layer 72 may include one or both of iron and cobalt, but in some embodiments the insertion layer 72 is essentially free of iron and/or cobalt. The presence of terbium in the insertion layer 72 has been found to improve the thermal robustness and thermal inertness of the total free layer, as compared to an insertion layer 72 that is free of terbium. The presence of terbium in the insertion layer 72 has also been found to improve tunnel magnetoresistance, increase the time dependent dielectric breakdown of the tunnel barrier layer 54, and improve the voltage control at the device level.

The capping layer 62 overlies the total free layer 60, and the top barrier layer 64 in embodiments where the top barrier layer 64 is present. The capping layer 62 may further promote the magnetic anisotropic effect of the MTJ stack 34. The capping layer 62 may include one or more of magnesium oxide, tungsten, ruthenium, platinum, hafnium, nickel chromium, or other materials, either as alloys or as elements. The capping layer 62 is non-magnetic, and the composition of the capping layer 62 is typically dependent on the material of the first and/or second free layers 70, 74. The optional top barrier layer 64 may include magnesium oxide in some embodiments, and the top barrier layer 64 is non-magnetic.

The capping layer 62 and/or the top barrier layer 64 may include terbium at from about 30 to about 100 weight percent in some embodiments, where the presence of terbium in the capping layer 62 and/or top barrier layer 64 may improve the thermal robustness and thermal inertness of the MTJ stack 34 as compared to a capping layer 62 and/or top barrier layer 64 that are essentially free of terbium.

The MTJ stack 34 that includes terbium at from about 30 to about 100 weight percent in one or both of the transition layer 48 and the insertion layer 72 has improved thermal robustness and thermal inertness. In fact, testing has shown the MTJ stack 34 to be capable of withstanding temperatures of about 400 degrees Celsius (° C.) in some embodiments. Solder reflow temperatures are typically about 260° C., so the inclusion of the terbium in the non-magnetic transition and/or insertion layers 48, 72 increases the thermal robustness well above the solder reflow temperature. The increased thermal robustness of the MTJ stack 34 may allow for anneals or other process steps after formation of the MTJ stack 34 that would damage an MTJ stack 34 without terbium in the non-magnetic transition and/or insertion layers 48, 72, which increases manufacturing options.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising a magnetic tunnel junction stack, wherein the magnetic tunnel junction stack comprises:
   a total pinned layer that comprises a first pinned layer that is magnetic;
   a total free layer that comprises a first free layer that is magnetic;
   a tunnel barrier layer positioned between the total pinned layer and the total free layer, wherein the tunnel barrier layer is non-magnetic; and
   a transition layer positioned between the total pinned layer and the tunnel barrier layer, wherein the transition layer is non-magnetic, wherein the transition layer comprises terbium at from about 30 to about 100 weight percent, based on a total weight of the transition layer, and wherein the transition layer comprises one or more of iron or cobalt at from about 5 to about 70 weight percent, based on the total weight of the transition layer.

2. The integrated circuit of claim 1 wherein the transition layer comprises the iron at from about 5 to about 70 weight percent, based on the total weight of the transition layer.

3. The integrated circuit of claim 1 wherein the transition layer comprises the cobalt at from about 5 to about 70 weight percent, based on the total weight of the transition layer.

4. The integrated circuit of claim 1 wherein the transition layer is amorphous.

5. The integrated circuit of claim 1 wherein the tunnel barrier layer comprises magnesium oxide.

6. The integrated circuit of claim 1 wherein the magnetic tunnel junction stack further comprises a polarizer layer positioned between the transition layer and the tunnel barrier layer.

7. The integrated circuit of claim 1 wherein:
the total pinned layer further comprises a second pinned layer that is magnetic, wherein the second pinned layer underlies the transition layer; and
a coupling layer positioned between the first pinned layer and the second pinned layer, wherein the coupling layer is non-magnetic.

8. The integrated circuit of claim 7 wherein:
the total free layer further comprises a second free layer that is magnetic, wherein the second free layer overlies the first free layer; and
an insertion layer positioned between the first free layer and the second free layer, wherein the insertion layer is non-magnetic, and wherein the insertion layer comprises terbium.

9. A method of producing an integrated circuit comprising:
forming a total fixed layer that is magnetic;
forming a transition layer overlying the total fixed layer, wherein the transition layer is non-magnetic, wherein the transition layer comprises terbium at from about 30 to about 100 weight percent, based on a total weight of the transition layer, and wherein the transition layer comprises one or more of iron or cobalt at from about 5 to about 70 weight percent, based on the total weight of the transition layer;
forming a tunnel barrier layer overlying the transition layer, wherein the tunnel barrier layer is non-magnetic; and
forming a first free layer overlying the tunnel barrier layer, wherein the first free layer is magnetic.

* * * * *